(12) United States Patent
Wu et al.

(10) Patent No.: US 9,419,015 B1
(45) Date of Patent: Aug. 16, 2016

(54) METHOD FOR INTEGRATING THIN-FILM TRANSISTORS ON AN ISOLATION REGION IN AN INTEGRATED CIRCUIT AND RESULTING DEVICE

(71) Applicant: GLOBALFOUNDRIES Inc., Grand Cayman (KY)

(72) Inventors: Xusheng Wu, Ballston Lake, NY (US); Changyong Xiao, Mechanicsville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/656,758

(22) Filed: Mar. 13, 2015

(51) Int. Cl.
| | | |
|---|---|---|
| H01L 27/12 | (2006.01) |
| H01L 21/84 | (2006.01) |
| H01L 21/265 | (2006.01) |
| H01L 29/66 | (2006.01) |
| H01L 29/06 | (2006.01) |
| H01L 21/266 | (2006.01) |
| H01L 29/78 | (2006.01) |
| H01L 29/786 | (2006.01) |
| H01L 21/8234 | (2006.01) |
| H01L 27/06 | (2006.01) |
| H01L 27/088 | (2006.01) |

(52) U.S. Cl.
CPC .......... H01L 27/1207 (2013.01); H01L 21/266 (2013.01); H01L 21/26513 (2013.01); H01L 21/84 (2013.01); H01L 29/0649 (2013.01); H01L 29/66757 (2013.01); H01L 29/66795 (2013.01); H01L 29/7851 (2013.01); H01L 29/78675 (2013.01); H01L 21/823412 (2013.01); H01L 27/0617 (2013.01); H01L 27/0886 (2013.01)

(58) Field of Classification Search
None
See application file for complete search history.

(56) References Cited

U.S. PATENT DOCUMENTS

| | | | | | |
|---|---|---|---|---|---|
| 6,911,383 | B2 * | 6/2005 | Doris | .................... | H01L 21/845 257/E21.703 |
| 7,456,055 | B2 * | 11/2008 | Orlowski | .............. | H01L 21/845 257/351 |
| 8,384,187 | B2 * | 2/2013 | Sawada | ............. | H01L 21/76229 257/506 |
| 8,461,008 | B2 * | 6/2013 | Cho | ................ | H01L 21/823431 257/401 |
| 8,501,607 | B1 * | 8/2013 | Juengling | ......... | H01L 29/66795 438/587 |
| 9,245,979 | B2 * | 1/2016 | Cai | .................... | H01L 29/66795 |
| 9,305,825 | B2 * | 4/2016 | Youn | ................. | H01L 21/76229 |
| 2007/0080387 | A1 * | 4/2007 | Liu | ........................ | H01L 28/82 257/303 |
| 2009/0294874 | A1 * | 12/2009 | Lee | ................. | H01L 21/823412 257/401 |
| 2013/0049136 | A1 * | 2/2013 | Wahl | ............... | H01L 21/823431 257/401 |
| 2014/0203376 | A1 * | 7/2014 | Xie | ................... | H01L 21/76224 257/401 |
| 2014/0227858 | A1 * | 8/2014 | Shen | ................. | H01L 21/76224 438/430 |
| 2014/0353795 | A1 * | 12/2014 | Tong | ................. | H01L 21/76224 257/506 |

* cited by examiner

*Primary Examiner* — Andres Munoz
(74) *Attorney, Agent, or Firm* — Ditthavong & Steiner, P.C.

(57) ABSTRACT

Methods for integrating core and I/O components in IC devices utilizing a TFT I/O device formed on STI regions, and the resulting devices are disclosed. Embodiments include forming STI and FinFET regions in a Si substrate, the FinFET region having first and second adjacent sections; forming a nitride layer and a silicon layer, respectively, over the STI region and both sections of the FinFET region; removing a first section of the silicon and nitride layers through a mask to expose the first FinFET section; implanting the exposed FinFET section with a dopant; removing remaining sections of the mask; removing a second section of the silicon and nitride layers through a second mask to expose the second FinFET section; implanting the second FinFET section with another dopant; removing remaining sections of the second mask; and forming a TFT on the remaining silicon layer, wherein the TFT channel includes the silicon layer.

14 Claims, 10 Drawing Sheets

Background

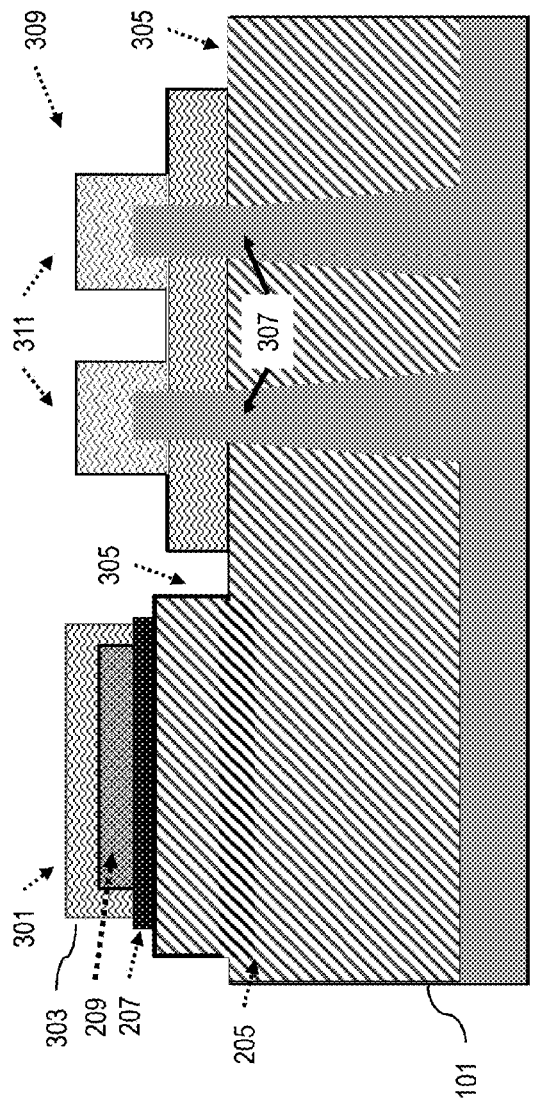
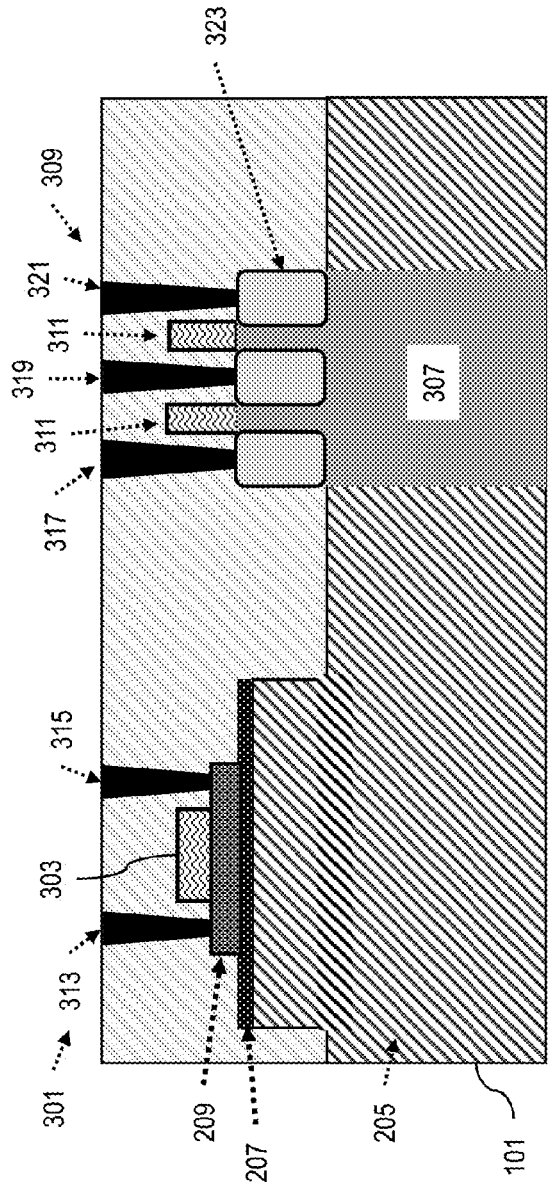

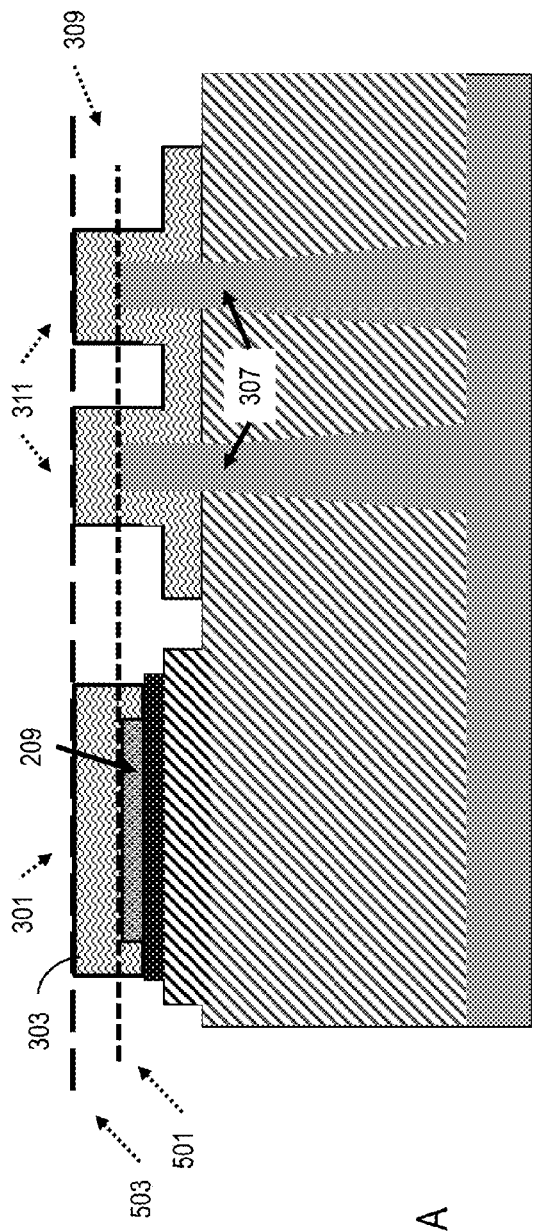
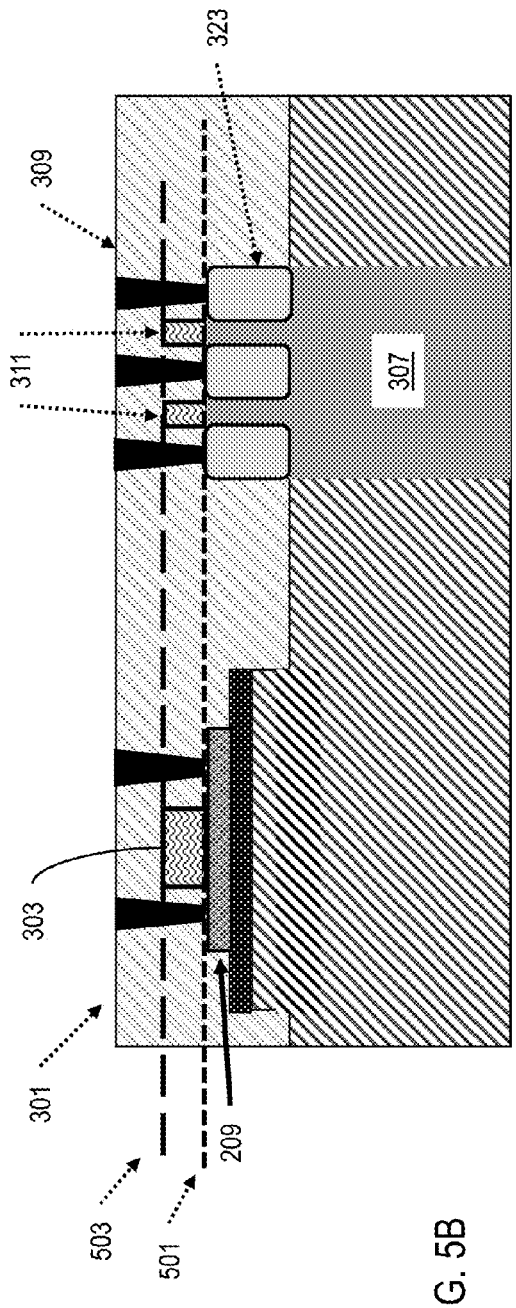
FIG. 5A
FIG. 5B

METHOD FOR INTEGRATING THIN-FILM TRANSISTORS ON AN ISOLATION REGION IN AN INTEGRATED CIRCUIT AND RESULTING DEVICE

TECHNICAL FIELD

The present disclosure relates generally to designing and fabricating integrated circuit (IC) devices. The present disclosure is particularly applicable to designing and fabricating IC devices with both core and in/out (I/O) components.

BACKGROUND

Generally, an IC device may include different types of components (e.g., transistors) that can provide different functionalities and have different applications. Also, an IC device can be designed to include planar type or fin-type components that may, for example, operate at different voltages, have different power consumptions, or provide different performances in a given application. For instance, a certain component in an IC may be part of a core module/section that may be designed to provide high performance and short channel effect (SCE) control at a given voltage or power consumption level. Another component may operate at a higher voltage and function as an interface (e.g., I/O) component. As a result, core components require a fin-type field-effect transistor (FinFET) structure, whereas I/O devices may be planar type devices. Although challenging, different types of components may be integrated into an IC device in order to meet application or industry demand. However, using the different manufacturing processes/structures requires extra steps and masks. Alternatively, using the FinFET structure for both means that they share the same bulk silicon, which engenders a bulk leakage concern for the I/O device.

FIG. 1 schematically illustrates a Si substrate that can be used to construct FinFET structures in an example IC device. Si substrate 101 includes Si fin regions 103 and 105, each of which may include a plurality of Si fins, wherein adjacent fins are separated by adjacent oxide regions 111. Additionally, the Si substrate 101 may include cavities filled with an oxide material to form shallow trench isolation (STI) regions 107 and 109. The Si fins may be utilized to construct FinFET structures while the STI regions provide protection against electrical current leakage between adjacent components in an IC device. In this example, the STI region 109 is a deeper STI, which may be formed post formation of an STI region (e.g., STI 107) by employing a similar process, where a deeper STI includes a thicker filling of oxide that extends to a deeper depth in the substrate 101. In integrating various types of components into a single IC device, for example, due to a three dimensional process flow used in FinFET technology, all components fabricated by the use of this technology utilize the FinFET structure. For example, an I/O device that would operate at a higher voltage (e.g., Vdd at gate) and have a thicker gate dielectric will be fabricated via the same process utilized in fabricating a core component that would be operating at a lower voltage with a shorter gate and a thinner gate dielectric. However, an I/O component does not require an advanced fabrication process and the SCE control due to its functionality. The I/O component may therefore be a planar type component, but as discussed, integrating planar and FinFET components may be challenging (e.g., additional process steps and masks). However, even if the two components were integrated in an IC device by using FinFET structures for both, the two components would share the same bulk (e.g., Si substrate) where bulk leakage current would be a concern for the I/O component.

A need therefore exists for a methodology for integrating I/O components into IC devices, with minimal additional process steps, and the resulting device.

SUMMARY

An aspect of the present disclosure is an IC device with integrated TFT components formed on an STI region with no junction to substrate leakage.

Another aspect of the present disclosure is a method for integrating TFT components in an IC device with minimal additional process steps by forming the TFTs on an STI region using nitride and silicon layers as both a mask and also the TFT channel region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a STI region and a FinFET region in a silicon (Si) substrate, the FinFET region having first and second adjacent sections; forming a nitride layer and a silicon layer, respectively, on an upper surface of the STI region and the first and second sections of the FinFET region; removing a first section of the silicon layer and the nitride layer through a mask to expose the first section of the FinFET region; implanting the first section of the FinFET region with a dopant; removing remaining sections of the mask; removing a second section of the silicon layer and the nitride layer through a second mask to expose the second section of the FinFET region; implanting the second section of the FinFET region with another dopant; removing remaining sections of the second mask; and forming a TFT on an upper surface of the silicon layer above the STI region, wherein the TFT channel includes the silicon layer.

Another aspect includes forming Si fins separated by oxide regions on the Si substrate in the FinFET region prior to forming the nitride and silicon layers; removing an upper section of the oxide regions to reveal upper sections of the Si fins after removing the second mask; and forming FinFETs over the upper sections of the Si fins.

Some aspects include forming the silicon layer with an upper surface coplanar with an upper surface of the Si fins. Another aspect includes forming an upper surface of a gate electrode of the TFT coplanar with an upper surface of gate electrodes of the FinFETs. One aspect includes forming the TFT as a planar type TFT. Another aspect includes recessing the STI region to create a cavity prior to forming the nitride layer and the silicon layer. In one aspect, the nitride layer and the silicon layer are conformally formed on the upper surface of the first and second sections of the FinFET region and in the cavity. One aspect includes removing the nitride layer and the silicon layer on the upper surface of the STI region adjacent to the cavity.

Another aspect of the present disclosure includes a device including an Si substrate; an STI region and a FinFET region on the Si substrate; a nitride layer and a silicon layer, respectively, on an upper surface of the STI region and the FinFET region; a first section of an upper surface of the FinFET region implanted with a dopant; a second section, adjacent to the first section, of the upper surface of the FinFET region implanted with another dopant; and a TFT on an upper surface of the silicon layer above the STI region, wherein the TFT channel includes the silicon layer.

Some aspects of the device include Si fins on the Si substrate in the FinFET region; and FinFETs formed over upper sections of the Si fins. In one aspect, an upper surface of the silicon layer is coplanar with upper surfaces of the Si fins. In another aspect, an upper surface of a gate electrode of the TFT is coplanar with an upper surface of gate electrodes of the FinFETs. In another aspect, the TFT includes a planar type device. In some aspects the STI region is recessed in the STI regions forming a cavity and the nitride layer and the silicon layer are formed in the cavity in the STI region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B illustrate cross sectional views of an example IC device including FinFETs and a TFT component, in accordance with an exemplary embodiment;

FIGS. 5A and 5B illustrate cross sectional views of an example IC device including FinFETs and a TFT component, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of extra process steps and masks and/or bulk leakage attendant upon integrating core and I/O devices in an IC device. The present disclosure addresses and solves such problems, for instance, by, inter alia, forming a TFT on an STI region for the I/O component with FinFETs for the core components, where minimal additional process steps may be utilized.

Figure 1:
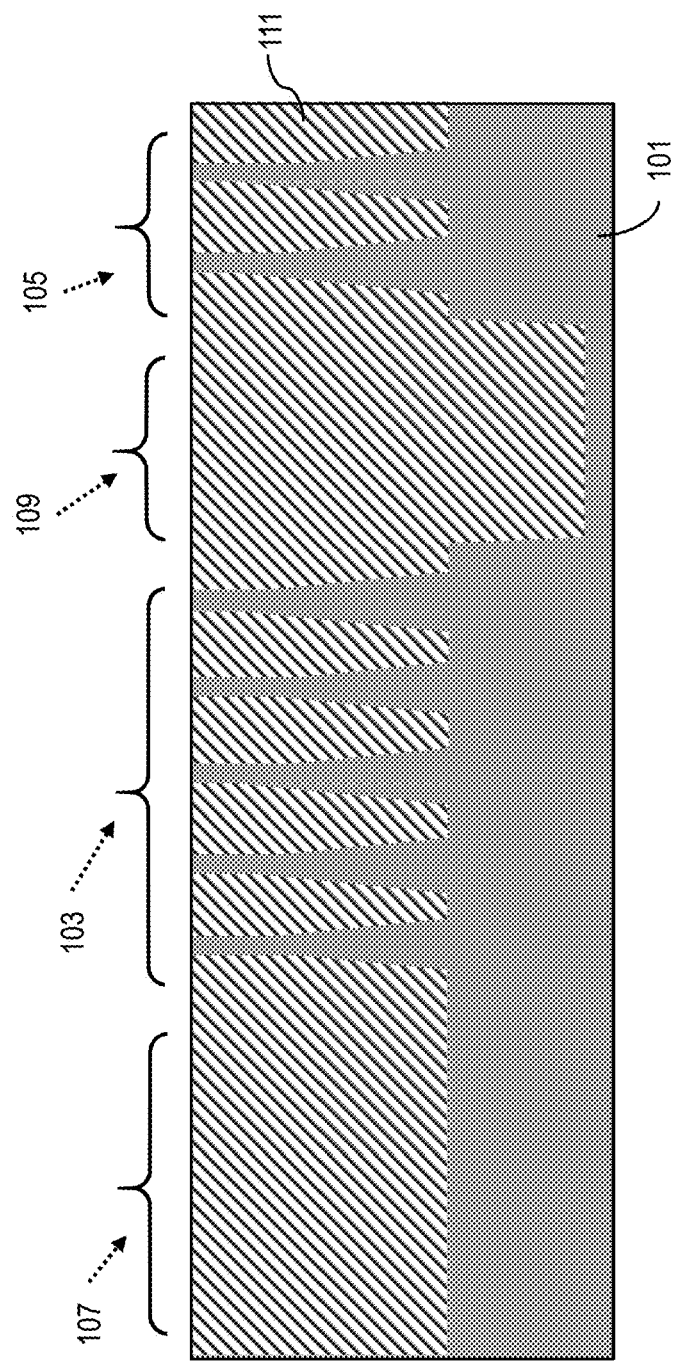
FIG. 1 schematically illustrates a Si substrate that can be used to construct FinFET structures in an example IC device.
Figure 2A:
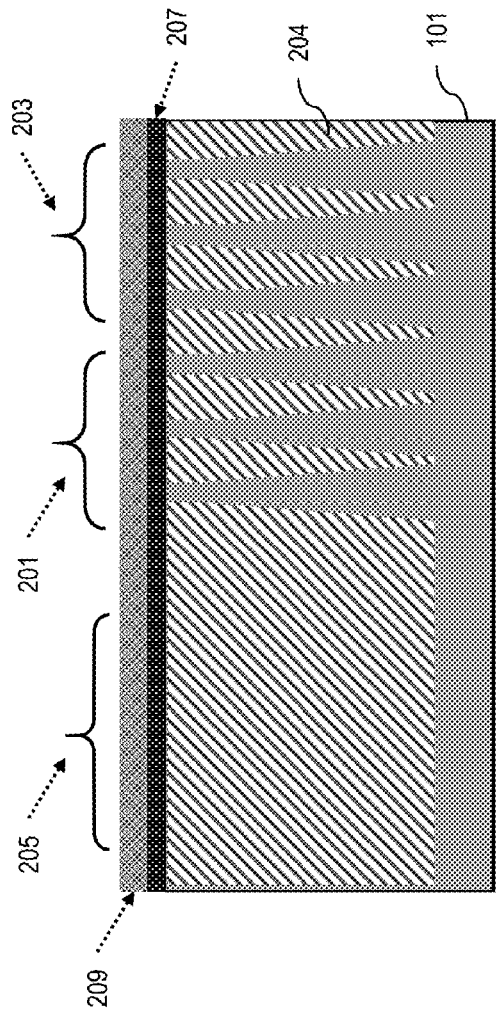
FIGS. 2A through 2G illustrate process steps for integrating a TFT component with FinFETs in an IC device, in accordance with an exemplary embodiment.

FIGS. 2A through 2G illustrate process steps for integrating a TFT component with FinFETs in an IC device, in accordance with an exemplary embodiment. FIG. 2A illustrates the Si substrate 101 including FinFET regions 201 and 203 with isolation regions 204, which may be filled with one or more dielectric materials such as silicon dioxide, between adjacent fins as well as an STI region 205. It is noted that the STI region 205 may be a deeper STI region such as the STI region 109. Additionally, FIG. 2A illustrates a nitride layer 207 and a polysilicon layer 209 that are, respectively, conformally deposited on an upper surface of the Si substrate 101. Although polysilicon is referenced herein, other types of silicon, such as amorphous silicon, may be used.

Figure 2B:
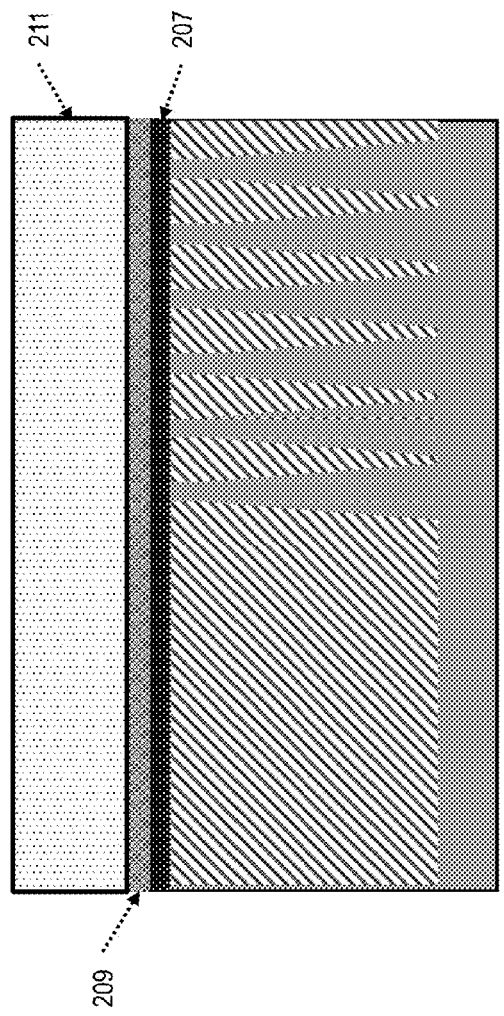
Figure 2C:
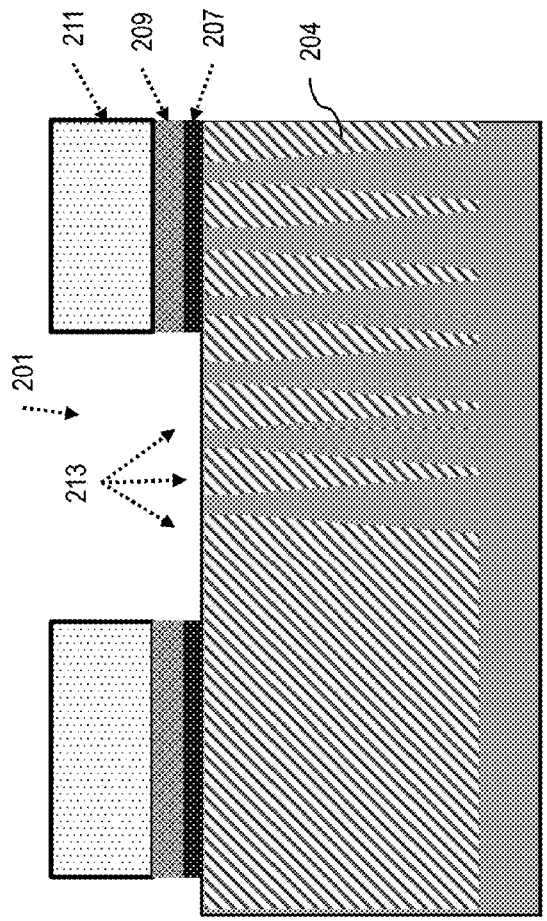
Figure 2D:
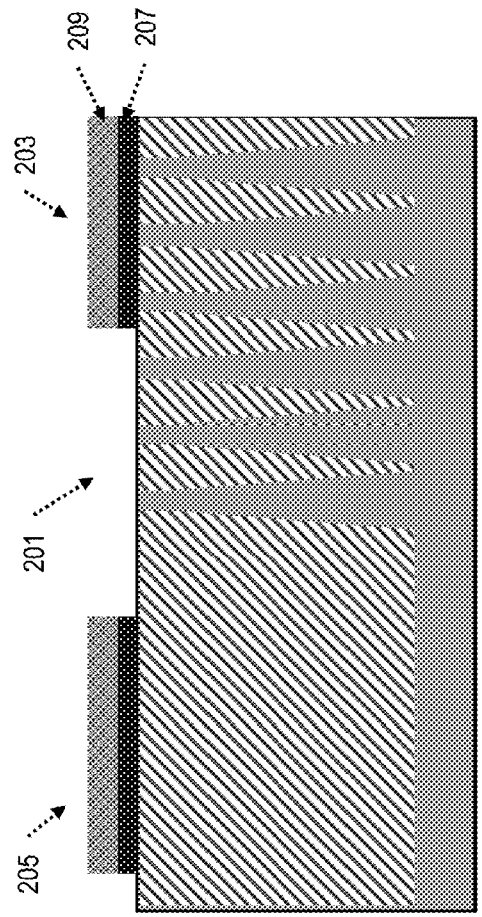

As illustrated in FIG. 2B, a mask (e.g., photoresist) layer 211 is formed on an upper surface of the polysilicon layer 209. In FIG. 2C, mask layer 211 is patterned, and a section of the mask layer 211 that is substantially above the fins 201 is removed (e.g., by a lithography process). Then sections of the polysilicon layer 209 and the nitride layer 207 in the same area are, respectively, removed (e.g., via chemical etch processes) to expose the upper surface of the fins 201 and oxide regions 204. Next, the exposed upper surfaces of the fins 201 are implanted with a dopant material 213 to form a P-well (or an N-well). The process continues in FIG. 2D where the remaining sections of the mask layer 211 are removed (e.g., standard lithography and cleaning) to expose the upper surfaces of the remaining sections of the polysilicon layer 209.

Figure 2E:
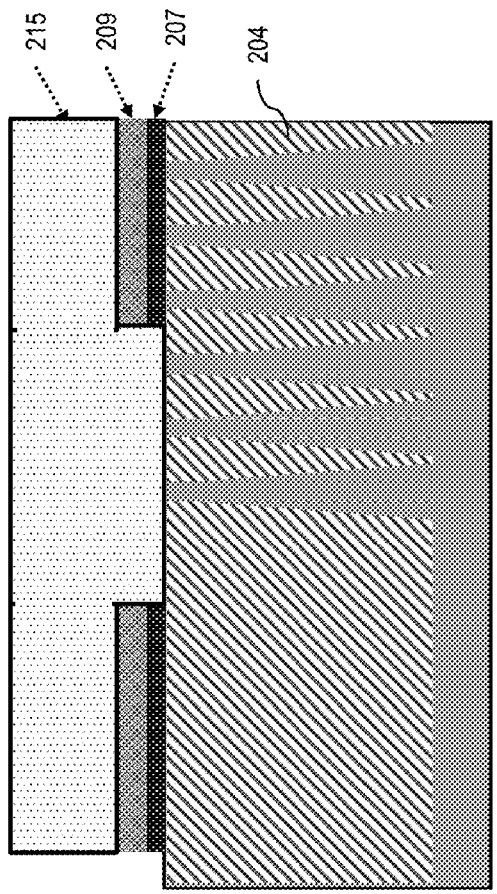
Figure 2F:
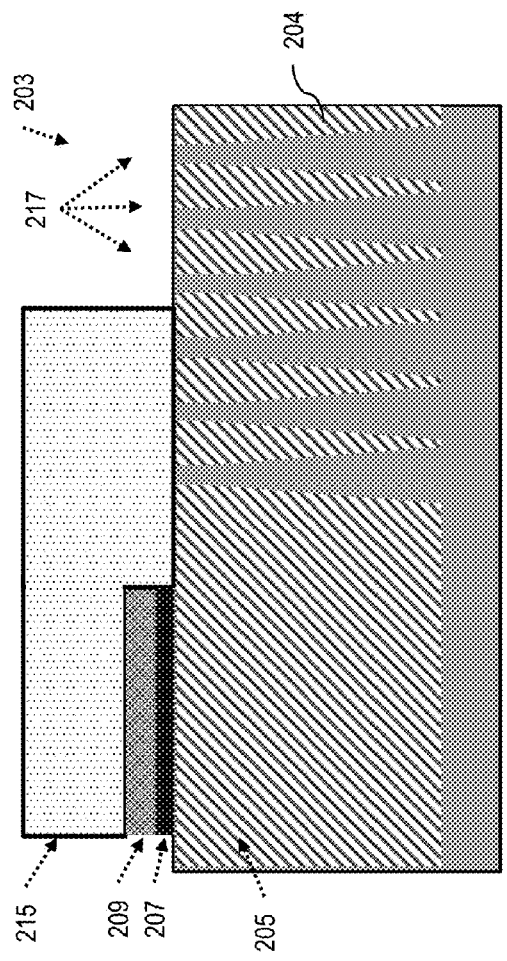
Figure 2G:
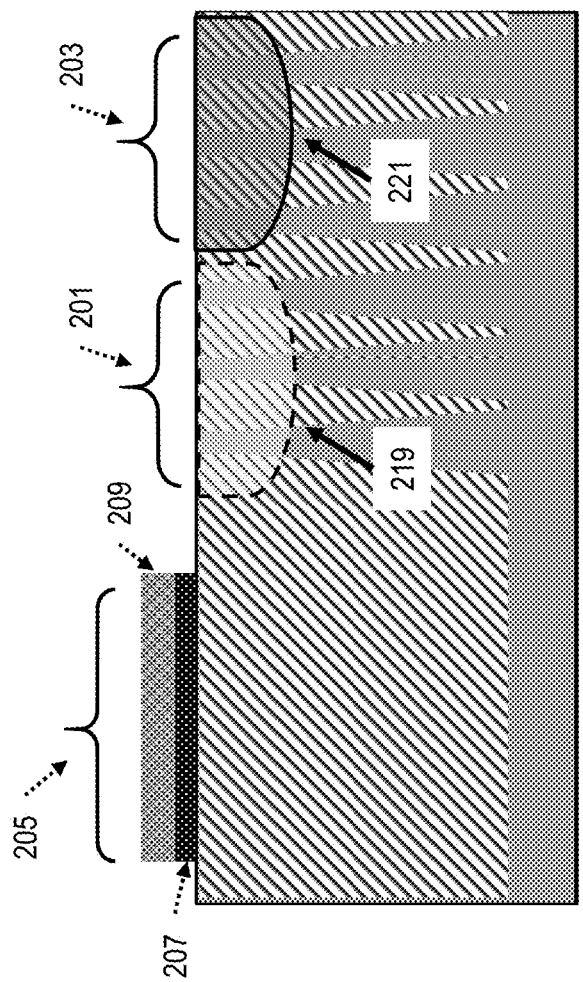

Adverting to FIG. 2E, another mask layer 215 is formed on the upper surface of the remaining sections of the polysilicon layer 209 that are above the fins 203 and the STI region 205 as well as on the exposed section of fins 201, and oxide regions 204. In FIG. 2F, a section of the mask layer 215 that is substantially above the fins 203 is removed (e.g., by a lithography process). Then, sections of the polysilicon layer 209 and the nitride layer 207 in the same area are, respectively, removed (e.g., via chemical etch processes) to expose the upper surface of the fins 203 and the intervening oxide regions 204. Next, the exposed FinFET region 203 is implanted by a dopant material 217 to form an N-well (or P-well). As illustrated in FIG. 2G, the remaining sections of the mask layer 215 are removed leaving a nitride layer 207 and a polysilicon layer 209 on the upper surface of the STI region 205. Further, conventional well-implanting processes may be utilized to implant the FinFET regions 201 and 203 including implanted upper sections 219 and 221, respectively, of the fins. As illustrated, the polysilicon layer 209 and the nitride layer 207, for the TFT, in the STI region 205 are formed without any additional mask and process steps. A conventional process flow may then proceed beginning with an oxide etch to reveal the fins. Next, a gate stack is formed (e.g., poly deposition and patterning, spacer formation, selective halo implants, and epitaxial silicon germanium (eSiGe) and epitaxial silicon growth) and a replacement gate is formed (including interlayer dielectric (ILD) deposition, CMP, poly removal, high-k dielectric deposition, work function metal deposition, and gate metal filling). Then, a silicide and contacts are formed (including trench silicide patterning and etching, nickel deposition and nickel silicide formation, contact patterning, and tungsten filling), followed by back end of line (BEOL) interconnections.

FIGS. 3A and 3B illustrate cross sectional views of an example IC device including FinFETs and a TFT component, in accordance with an exemplary embodiment. Additional standard IC fabrication processes may be applied to the structure developed in FIG. 2G to construct a TFT component as well as a FinFET component. FIG. 3A is a fin-cut cross-sectional view illustrating a TFT component 301 that includes a nitride layer 207 and a polysilicon layer 209 that are, respectively, on the upper surface of the STI region 205 on the Si substrate 101, wherein the polysilicon layer 209 can serve as a planar channel for the TFT component 301. Additionally, a gate stack 303, including a replacement metal gate (RMG) on a high-k dielectric, with spacers at opposite sides thereof, is formed on the nitride layer 207 and the polysilicon layer 209 to form the TFT component 301. Moreover, an upper section of the oxide regions 305 is removed to reveal upper sections of Si fins 307 to form FinFET structures 309. The FinFET structures 309 include gate stacks 311, each of which in turn includes a RMG over a high-k dielectric, with spacers formed on opposite sides thereof, over and perpendicular to the upper portions of the fins 307. FIG. 3B is a gate-cut cross-sectional view illustrating the TFT component 301 with trench silicide 313 and 315 down to source and drain contacts as well as trench silicides 317, 319, and 321 down to source/drain contacts 323.

Figure 4A:
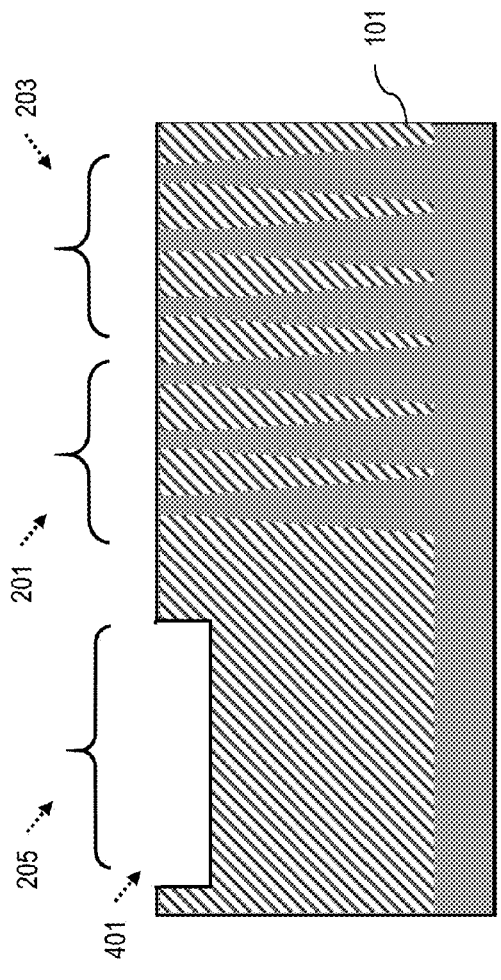
FIGS. 4A through 4D illustrate process steps for integrating a TFT component with FinFETs in an IC device, in accordance with another exemplary embodiment.
Figure 4B:
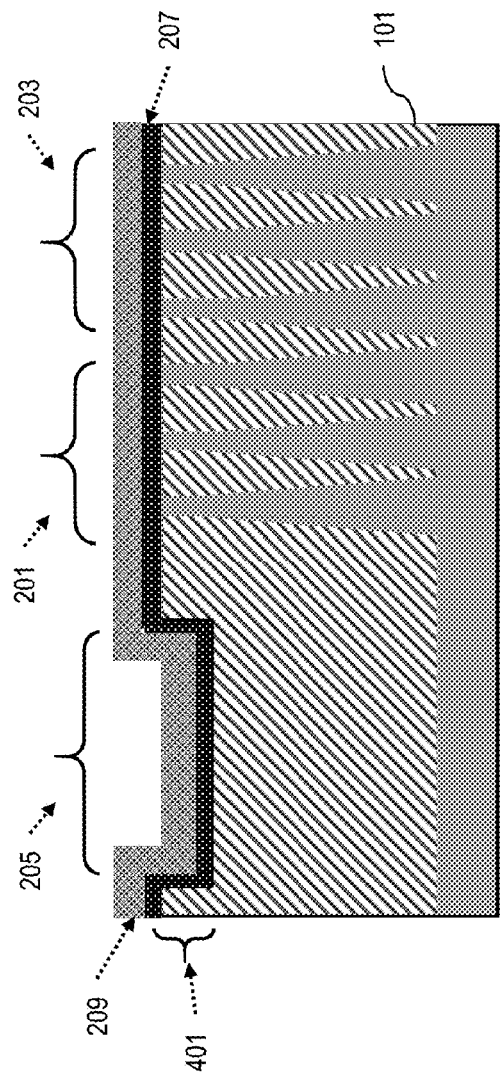

FIGS. 4A through 4D illustrate process steps for integrating a TFT component and FinFETs in an IC device, in accordance with another exemplary embodiment. In FIG. 4A, a standard IC fabrication process (e.g., masking and oxide etching) is utilized to recess the STI region 205 to create a cavity 401 prior to forming the nitride layer 207 and the polysilicon layer 209 shown in FIG. 4B. The nitride layer 207 and the polysilicon layer 209 are conformally formed on the upper surface of the 201 and 203 sections of the FinFET region and in the cavity 401. The remaining process steps may continue similarly as discussed in FIGS. 2B through 2F to result a structure similar to the one illustrated in FIG. 2G. However, any nitride layer 207 and polysilicon layer 209 on the upper surface of the STI region 205 adjacent to the cavity 401 are removed as well as on the upper surfaces of the FinFET regions 201 and 203.

Figure 4C:
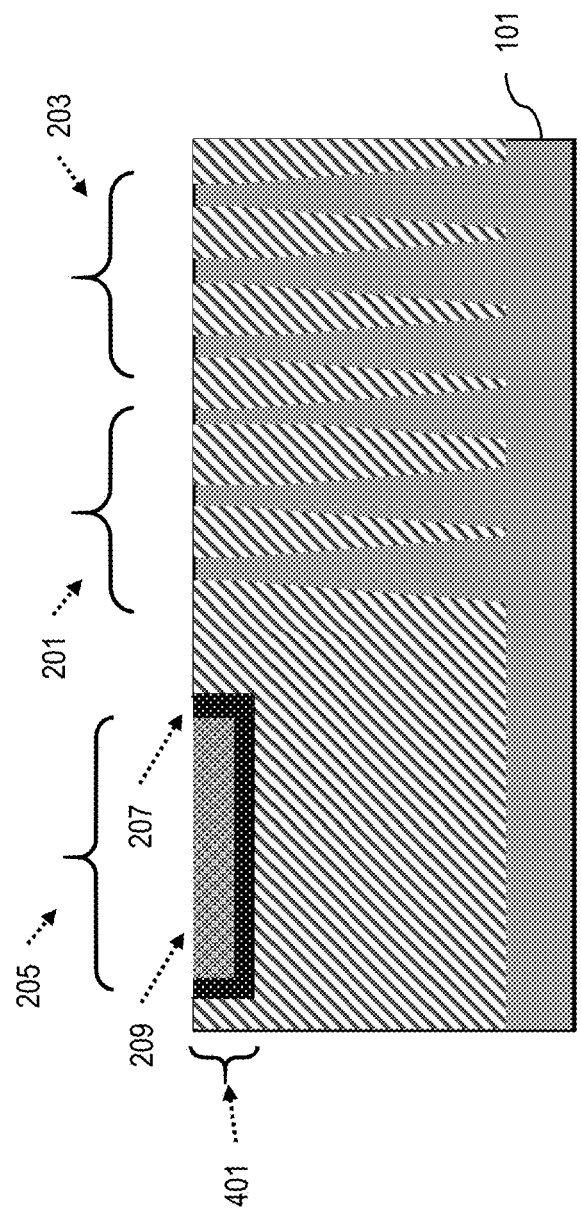
Figure 4D:
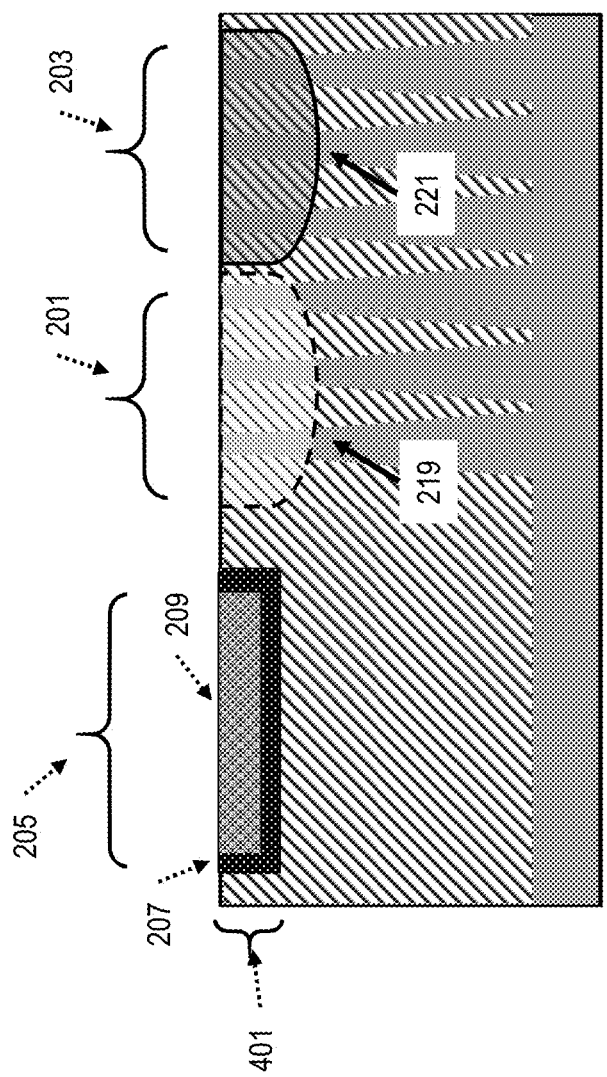

FIG. 4C illustrates a third step in an alternative process flow. Specifically, after nitride layer 207 and polysilicon layer 209 are formed as in FIG. 2B, the nitride layer 207 and polysilicon layer 209 are planarized down to an upper surface of STI region 205. Thus, nitride layer 207 and polysilicon layer 209 only remain in cavity 401, as shown in FIG. 4C. The process then may proceed substantially as discussed with respect to FIGS. 2B through 2F with the exception that there would be no nitride or polysilicon layers formed on or removed from the FinFET regions 201 and 203. FIG. 4D illustrates a resulting structure based on the processes discussed in relation to FIGS. 4A through 4C. It is noted that the resulting structures illustrated in FIGS. 2G and 4D are similar except that the final nitride/polysilicon layer in FIG. 2G is on the upper surface of the STI region 205, where in the structure of FIG. 4D, the final nitride/polysilicon layer is in the recessed cavity 401 in the STI region 205. This difference will be further discussed. Conventional processes may then proceed, as discussed above beginning with active fin reveal and continuing through BEOL interconnections.

FIGS. 5A and 5B illustrate cross sectional views of an example IC device including FinFETs and a TFT component, in accordance with an exemplary embodiment. FIG. 5A is a fin-cut cross-sectional view and FIG. 5B is a gate-cut cross-sectional view illustrating a TFT component 301 as well as a FinFET component 309 that, respectively, include gate structures 303 and 311. Although the gate structures 303 and 311 in FIGS. 5A and 5B are similar to those in FIGS. 3A and 3B, it is noted that in FIGS. 5A and 5B the polysilicon layer 209 has an upper surface level 501 that is coplanar with an upper surface of the Si fins 307. Also, the upper surface of the gate electrode 303 of the TFT component 301 is at a level 503 that is coplanar with the upper surface of the gate electrodes 311 of the FinFET component 309. These coplanar properties would be advantageous and more efficient as the IC device progresses through additional fabrication process steps, but have the disadvantage of an additional step of forming the cavity.

The embodiments of the present disclosure can achieve several technical effects, including integrating I/O devices with FinFETs in an IC device where minimal additional process steps may be introduced. Because the I/O device is a TFT component formed on an STI or a deep STI region, there is little or no impact on a standard IC fabrication process (e.g., a FinFET flow), no junction to substrate leakage, high drive ability and ultra-low Isoff and Igoff, as the TFT may be formed with a large gate length, gate oxide, and gate width. Also, a process to form the TFT component can be compatible with a current planar-type IC fabrication technology. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a shallow trench isolation (STI) region and a fin-type field-effect transistor (FinFET) region in a silicon (Si) substrate, the FinFET region having first and second adjacent sections;
    forming a nitride layer and a silicon layer, respectively, on an upper surface of the STI region and the first and second sections of the FinFET region;
    removing a first section of the silicon layer and the nitride layer through a mask to expose the first section of the FinFET region;
    implanting the first section of the FinFET region with a dopant;
    removing remaining sections of the mask;
    removing a second section of the silicon layer and the nitride layer through a second mask to expose the second section of the FinFET region;
    implanting the second section of the FinFET region with another dopant;
    removing remaining sections of the second mask; and
    forming a thin-film transistor (TFT) on an upper surface of the silicon layer above the STI region, wherein the TFT channel comprises the silicon layer.

2. The method of claim 1, further comprising:
forming Si fins separated by oxide regions on the Si substrate in the FinFET region prior to forming the nitride and silicon layers;
removing an upper section of the oxide regions to reveal upper sections of the Si fins after removing the second mask; and
forming FinFETs over the upper sections of the Si fins.

3. The method of claim 2, further comprising:
forming the silicon layer with an upper surface coplanar with an upper surface of the Si fins.

4. The method of claim 2, further comprising:
forming an upper surface of a gate electrode of the TFT coplanar with an upper surface of gate electrodes of the FinFETs.

5. The method of claim 1, further comprising:
forming the TFT as a planar type TFT.

6. The method of claim 1, further comprising:
recessing the STI region to create a cavity prior to forming the nitride layer and the silicon layer.

7. The method of claim 6, wherein the nitride layer and the silicon layer are conformally formed on the upper surface of the first and second sections of the FinFET region and in the cavity.

8. The method of claim 6, further comprising:
removing the nitride layer and the silicon layer on the upper surface of the STI region adjacent to the cavity.

9. A method comprising:
forming a shallow trench isolation (STI) region and a fin-type field-effect transistor (FinFET) region in a silicon (Si) substrate, the FinFET region having first and second adjacent sections;
forming a nitride layer and a silicon layer, respectively, on an upper surface of the STI region and the first and second sections of the FinFET region;
removing a first section of the silicon layer and the nitride layer through a mask to expose the first section of the FinFET region;
implanting the first section of the FinFET region with a dopant;
removing remaining sections of the mask;
removing a second section of the silicon layer and the nitride layer through a second mask to expose the second section of the FinFET region;
implanting the second section of the FinFET region with another dopant;
removing remaining sections of the second mask;
forming a thin-film transistor (TFT) on an upper surface of the silicon layer above the STI region, wherein the TFT channel comprises the silicon layer;
forming Si fins separated by oxide regions on the Si substrate in the FinFET region prior to forming the nitride and silicon layers;
removing an upper section of the oxide regions to reveal upper sections of the Si fins after removing the second mask; and
forming FinFETs over the upper sections of the Si fins.

10. The method of claim 9, further comprising:
forming the silicon layer with an upper surface coplanar with an upper surface of the Si fins; and
forming an upper surface of a gate electrode of the TFT coplanar with an upper surface of gate electrodes of the FinFETs.

11. The method of claim 9, further comprising:
forming the TFT as a planar type TFT.

12. The method of claim 9, further comprising:
recessing the STI region to create a cavity prior to forming the nitride layer and the silicon layer.

13. The method of claim 12, wherein the nitride layer and the silicon layer are conformally formed on the upper surface of the first and second sections of the FinFET region and in the cavity.

14. The method of claim 12, further comprising:
removing the nitride layer and the silicon layer on the upper surface of the STI region adjacent to the cavity.

* * * * *